United States Patent
Lin

(10) Patent No.: US 7,394,080 B2
(45) Date of Patent: Jul. 1, 2008

(54) MASK SUPERPOSITION FOR MULTIPLE EXPOSURES

(75) Inventor: Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 224 days.

(21) Appl. No.: 11/317,974

(22) Filed: Dec. 23, 2005

(65) Prior Publication Data

US 2006/0139603 A1    Jun. 29, 2006

Related U.S. Application Data

(60) Provisional application No. 60/638,878, filed on Dec. 23, 2004.

(51) Int. Cl.
*H01J 37/08* (2006.01)
*G21K 5/10* (2006.01)
*G03F 7/20* (2006.01)

(52) U.S. Cl. ............... 250/492.22; 250/491.1; 250/492.1; 250/492.2; 250/492.3

(58) Field of Classification Search ............. 250/491.1, 250/492.22
See application file for complete search history.

(56) References Cited

U.S. PATENT DOCUMENTS

| | | | | |
|---|---|---|---|---|
| 4,167,676 A | * | 9/1979 | Collier | 250/492.2 |
| 4,426,584 A | * | 1/1984 | Bohlen et al. | 250/492.2 |
| 4,968,893 A | * | 11/1990 | Yasuda et al. | 250/492.2 |
| 5,087,537 A | * | 2/1992 | Conway et al. | 430/15 |
| 5,298,365 A | * | 3/1994 | Okamoto et al. | 430/311 |
| 5,552,611 A | * | 9/1996 | Enichen | 250/491.1 |
| 6,137,111 A | * | 10/2000 | Yamada et al. | 250/492.2 |
| 6,222,195 B1 | * | 4/2001 | Yamada et al. | 250/492.2 |
| 6,403,966 B1 | * | 6/2002 | Oka | 250/372 |
| 6,610,988 B1 | * | 8/2003 | Yamada | 250/492.22 |
| 6,664,011 B2 | * | 12/2003 | Lin et al. | 430/5 |
| 7,098,991 B2 | * | 8/2006 | Nagasaka et al. | 355/53 |
| 7,177,008 B2 | * | 2/2007 | Nishi et al. | 355/53 |
| 2003/0072051 A1 | * | 4/2003 | Myers et al. | 359/115 |
| 2003/0081192 A1 | * | 5/2003 | Nishi | 355/69 |
| 2005/0133732 A1 | * | 6/2005 | Ohtomo et al. | 250/492.1 |
| 2006/0139603 A1 | * | 6/2006 | Lin | 355/67 |
| 2007/0003878 A1 | * | 1/2007 | Paxton et al. | 430/311 |

* cited by examiner

*Primary Examiner*—David A. Vanore
*Assistant Examiner*—Bernard Souw
(74) *Attorney, Agent, or Firm*—Haynes Boone, LLP

(57) ABSTRACT

An exposure system includes a mask stage module adapted for holding a first mask and a second mask, wherein the first mask is configured for illumination by a first beam to form a transformed first beam having a first pattern from the first mask and the second mask is configured for illumination by a second beam to form a transformed second beam having a second pattern from the second mask. The exposure system also includes a beam combiner configured to combine the transformed first and second beams to form a resultant beam, wherein the resultant beam is projected into a substrate coated with a photoresist layer.

20 Claims, 9 Drawing Sheets

Fig. 2a
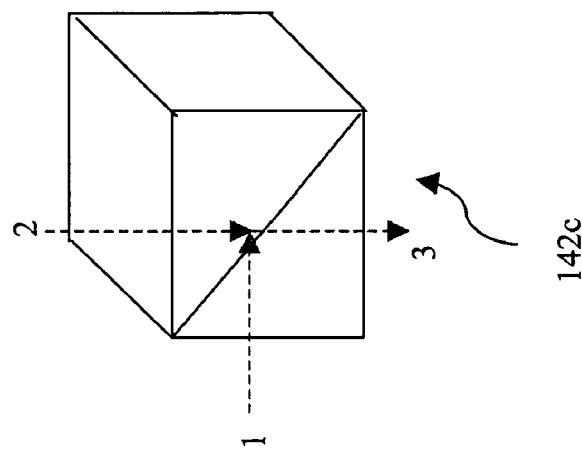
142c
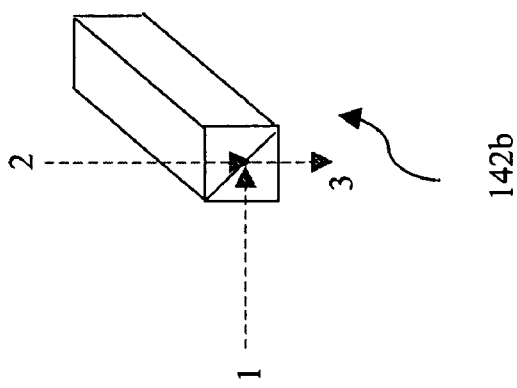
142b
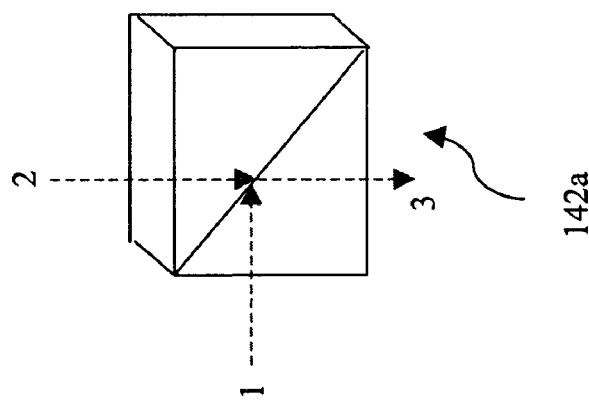
142a
Fig. 2b
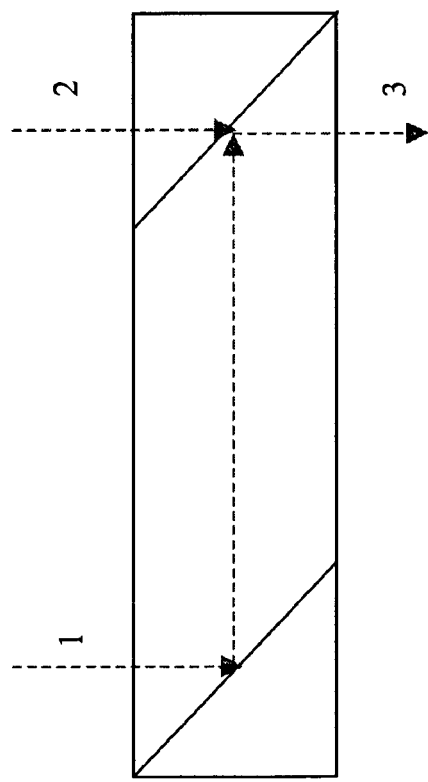

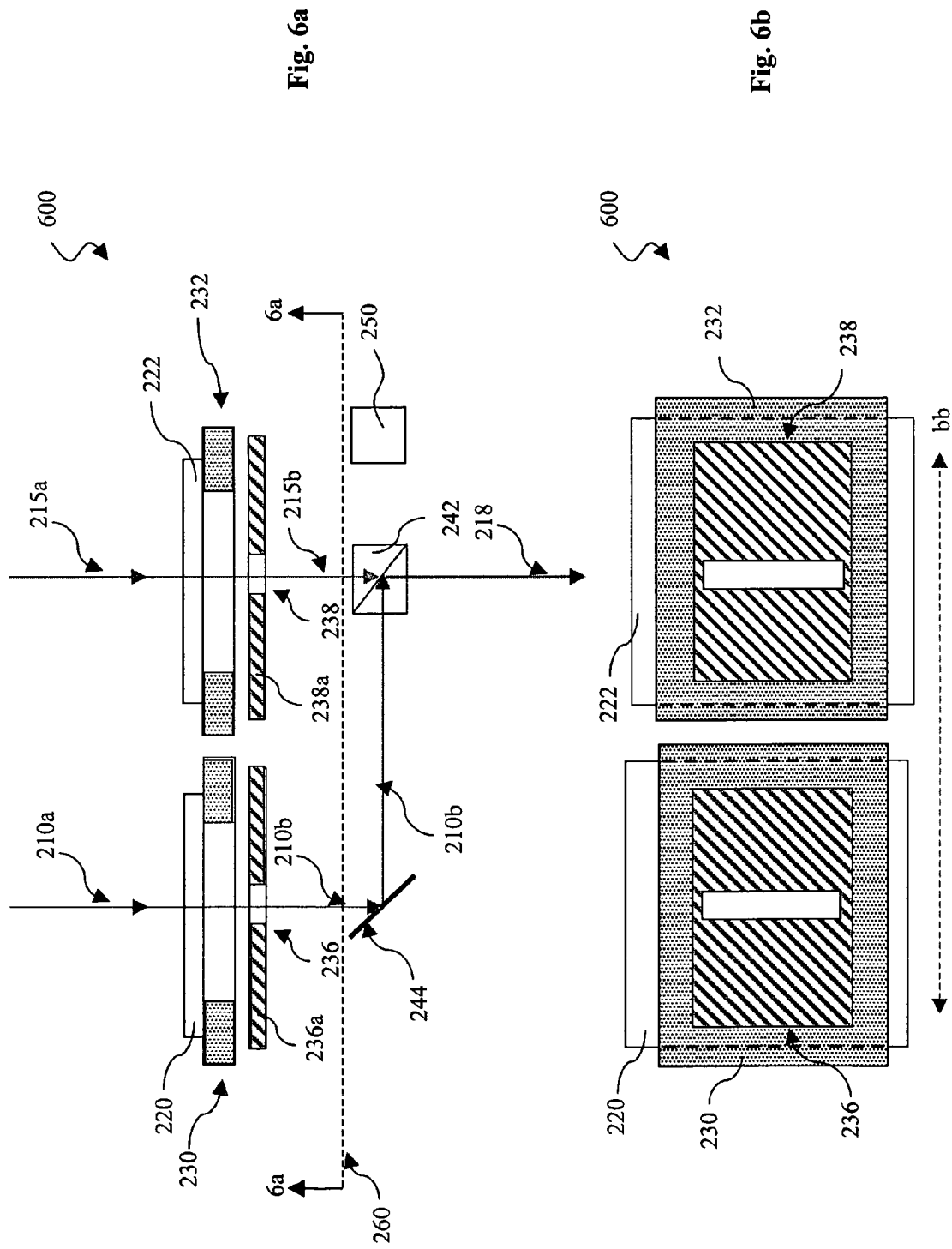

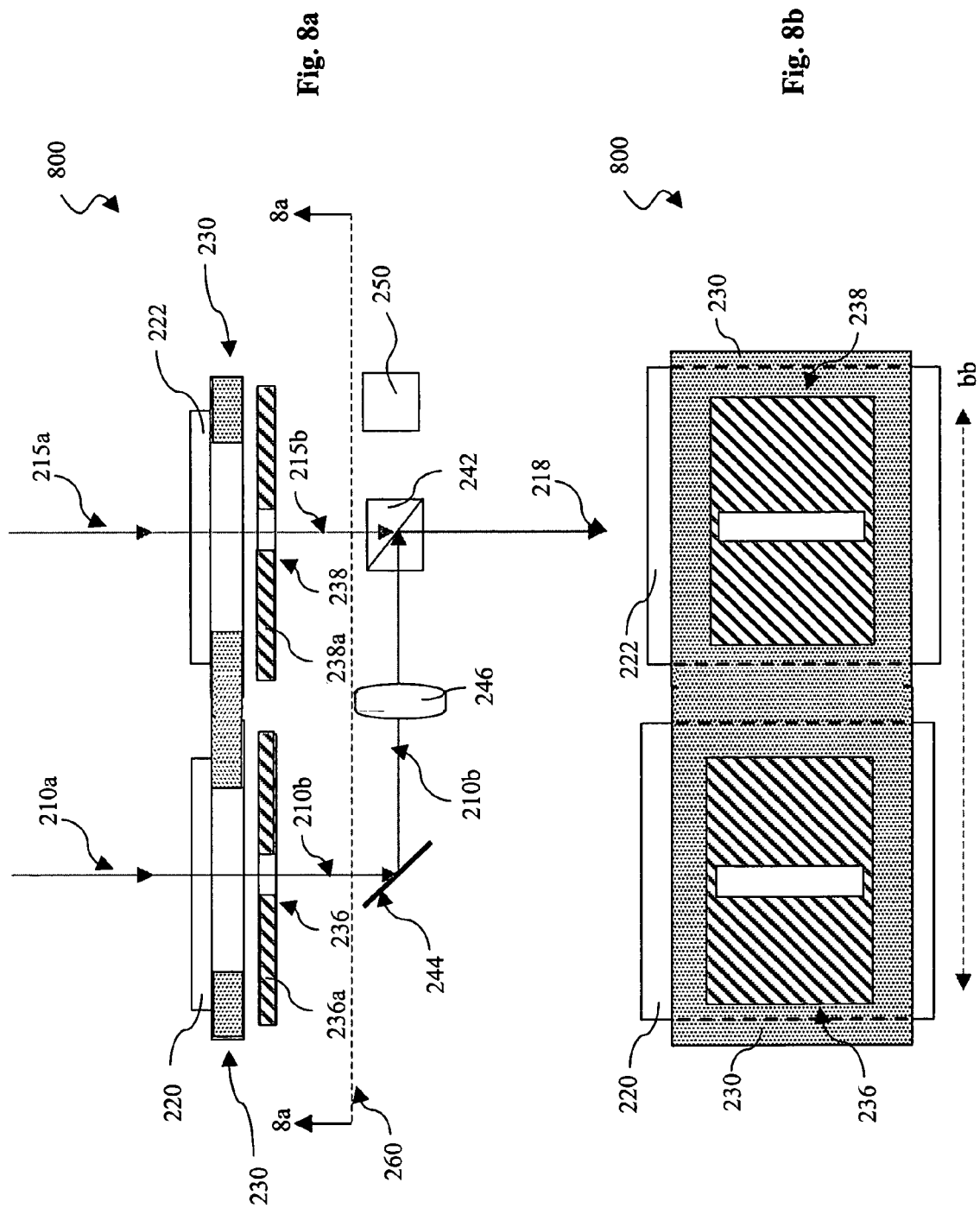

US 7,394,080 B2

MASK SUPERPOSITION FOR MULTIPLE EXPOSURES

CROSS-REFERENCE

This application claims priority from U.S. Provisional Patent Application Ser. No. 60/638,878, filed on Dec. 23, 2004, and entitled "MASK SUPERPOSITION FOR MULTIPLE EXPOSURE".

BACKGROUND

The semiconductor integrated circuit (IC) technology has progressed rapidly in continued minimization of feature size and maximization of packing density. The minimization of feature size relies on the improvement in photolithography and its ability to print smaller features. For example, an alternating phase shifting mask can be used to print smaller features from a given imaging tool. The alternating phase shifting mask is usually accompanied by a second trim mask. However, double exposures and changing masks often result in higher manufacturing cost, lower manufacturing throughput, and more alignment issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

FIGS. 2a and 2b illustrates perspective views of various embodiments of a beam splitter used in the double-mask lithography system of FIG. 1.

FIGS. 3a, 4, 5, and 6a are sectional views of embodiments of a double-mask lithography system having two mask stages.

FIG. 3b is a top view of an embodiment of the double-mask lithography system having two mask stages of FIG. 3a.

FIG. 6b is a top view of an embodiment of the double-mask lithography system having two mask stages of FIG. 6a.

FIGS. 8a and 8b are a sectional and top views of an embodiment of a double-mask lithography system having a single mask stage, respectively.

DETAILED DESCRIPTION

Figure 1:
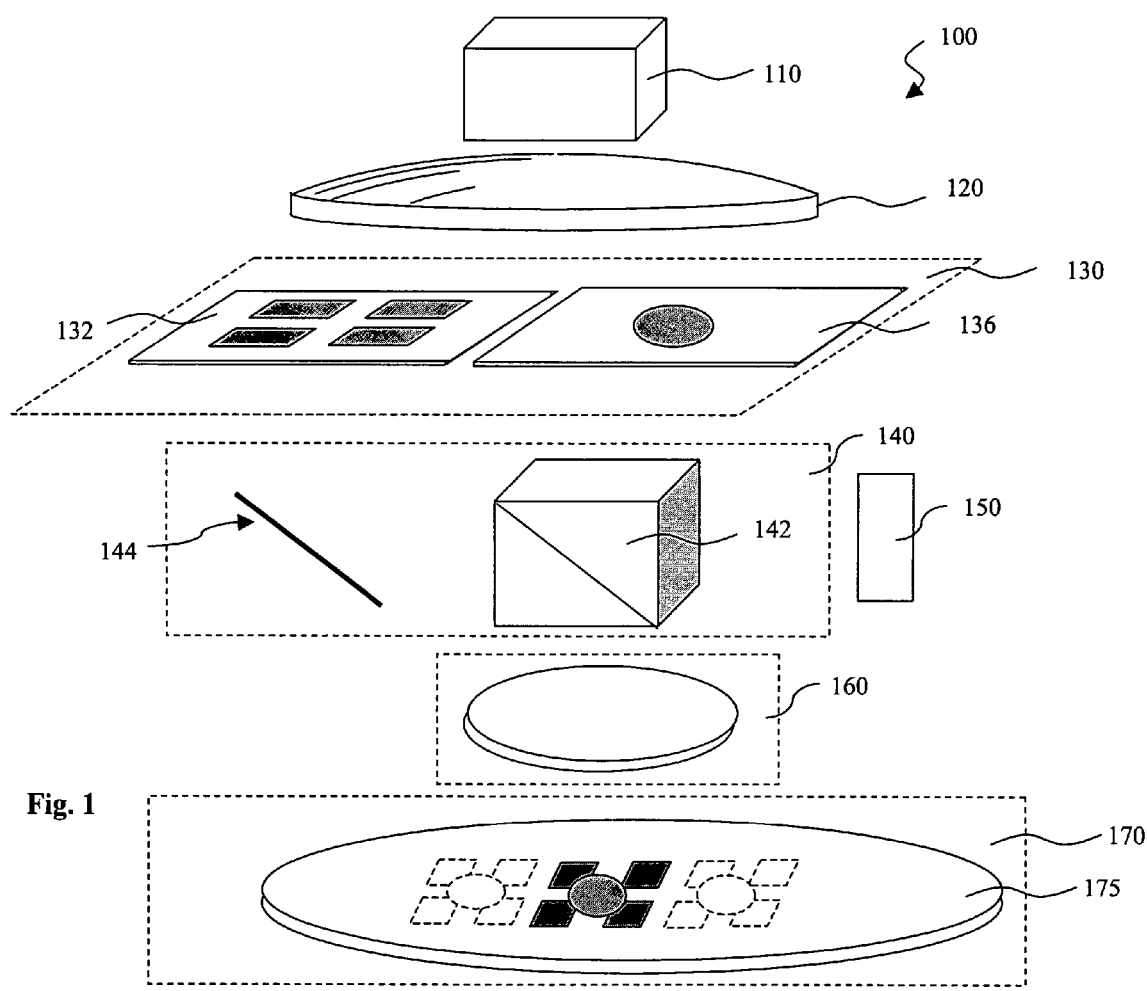
FIG. 1 is a schematic view of an exemplary embodiment of a double-mask lithography system.

The present disclosure relates generally to a photolithography system and, more particularly, to a lithography system for mask superposition. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a schematic view of an exemplary embodiment of a double-mask lithography system 100. The double-mask lithography system 100 includes a radiation source 110. The radiation source 110 may be a suitable light source such as an ultra-violet (UV), deep ultra-violet (DUV), or extreme ultra-violet (EUV) source. For example, the radiation source 110 may be, but not limited to, a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a wavelength below approximately 100 nm. The radiation source 110 may provide at least two radiation beams by a suitable way including by providing a plurality of sub-radiation source elements and by splitting a beam using a beam splitter.

The double-mask lithography system 100 also includes an illumination system (e.g., a condenser) 120. The illumination system 120 may comprise a single lens or a lens module having multiple lenses and/or other lens components. For example, the illumination system 120 may comprise microlens arrays, shadow masks, or other structures designed to aid in directing radiation beams from the radiation source 110 onto photomasks ("masks" or "reticles").

The double-mask lithography system 100 also includes a mask module 130. The mask module may include two masks such as a first mask 132 and a second mask 136 used during a lithography process. Each of the two masks may comprise a transparent substrate and an absorption layer. The transparent substrate may use fused silica ($SiO_2$) relatively free of defects, borosilicate glass, or soda-lime glass. The absorption layer may be formed using a plurality of processes and materials, such as depositing a metal film made with chromium (Cr), iron oxide, or an inorganic film made with MoSi, ZrSiO, SiN, and/or TiN. The absorption layer may be patterned to have one or more openings where light may travel through without being absorbed and have one or more absorption areas where light may be completely or partially blocked thereby. As an example, the first mask 132 may be an alternating phase shift mask (AltPSM) and the second mask 136 may be a binary intensity mask (BIM or binary mask). The BIM mask may include chrome areas and transparent quartz areas. The AltPSM mask may employ alternating areas of chrome and 180 degree-shifted quartz. In one embodiment, the two masks can be manipulated in translational and rotational mode with respect to each other. In another embodiment, one of the two masks may be designated as a reference mask. As an example, the first mask 132 may be designated as a reference mask for clarification in the following description. At least the second mask 136 is adjustable in translational and rotational modes relative to the reference mask.

The mask module 130 may comprise at least one mask stage. The mask stage has a scan function. The mask stage can hold the two masks 132 and 136 and manipulate the two masks in transitional and/or rotational modes for registration and alignment. In one embodiment, the mask module 130 may comprise a single mask stage to hold both masks. The single mask stage may hold the two masks in parallel. At least the second mask is adjustable relative to the first mask (reference mask) in transitional and/or rotational modes. In another example, the single mask stage is designed and configured as an L-shaped mask stage. The L-shaped mask stage may have two arms each for holding one mask such that the two masks are perpendicular to each other. In another embodiment, the mask stage module 130 may comprise two separate mask stages, one each for of the two masks. The two separate mask stages may be configured so that the two masks held thereon are parallel, perpendicular, or some desired angle. The two separate mask stages may be further configured such that a first optical path from the first mask to a substrate, wherein the two beams from the two masks are combined and projected to, is substantially equal to a second optical path from the second mask to the substrate.

The double-mask lithography system 100 may further comprise two slots (or sometimes referred to as slits), each slot may be configured underlying one of the two masks for defining an instantaneous scanning area.

The double-mask lithography system 100 includes a beam combiner 140 to combine a first beam from the first mask and a second beam from the second mask. The beam combiner 140 has a beam splitter 142, which can split a beam into two beams and combine two beams into one. The beam splitter 142 may be made in various structure, material, shape, and dimension depending on specific applications and configuration of the double-mask lithography system 100. For example, as illustrated in FIG. 2a, the beam splitter may be a flat one 142a, a long one 142b, a cubic one 142c, or other proper shape. Incoming beams 1 and 2 can be combined into an outgoing beam 3, as shown in FIG. 2a. The dimension of the beam splitter may be smaller than the dimension of the photomasks and may depend on the width of the slot. As an example, the masks may have a size of 6 inches×6 inches. The dimension of a scanning-area-defining slot may be 5 mm×26 mm. The beam splitter may be a flat one having a dimension of about 28 mm×28 mm×6 mm, a long one having a dimension of about 6 mm×6 mm×28 mm, or a cubic one having a dimension of about 28 mm×28 mm×28 mm. The beam splitter may be made of optical glass, fused quartz, calcium fluoride, or other suitable material. In one example, a beam splitter is made from two triangular glass prisms glued together at their base. The beam splitter may be a polarizing beam splitter (PBS) which reflects light in one orientation of polarization while light in the orthogonal polarization state passes therethrough.

The beam combiner 140 may comprise a mirror 144 configured to redirect the first beam to the beam splitter. The dimension of the mirror 144 may also depend on the width of the slot. The beam combiner 140 may comprise a relay lens configured in one of the two optical paths such that the two optical paths, one from the first mask to the substrate and the another from the second mask to the substrate, substantially equal. The beam combiner 140 may include other proper components for implementing combination of the two beams.

Referring again to FIG. 1, the double-mask lithography system 100 may further comprise a beam monitor 150. The resultant beam combined from the first beam and the second beam can be directed along a first direction to the substrate and may have a second component along a second direction. The beam monitor 150 may be positioned next to the beam splitter 142 to receive the resultant beam along the second direction for monitoring.

The double-mask lithography system 100 also includes an imaging lens 160. The imaging lens 160 may comprise a single lens or a plurality of lens elements configured to project the resultant beam onto the substrate.

The double-mask lithography system 100 may also include a substrate stage 170 for holding and manipulating the substrate 175 during a photolithography patterning process. The substrate 175 may be a semiconductor wafer such as glass, silicon, germanium, diamond, or a compound semiconductor. The substrate 175 may include a plurality of layers formed thereon, each having patterned structures. The substrate 175 may be further coated with a photoresist layer for lithography patterning process.

During a lithography process, the first beam may be directed to the first mask forming a first pattern and a second beam directed to the second mask forming a second pattern. The first beam may be redirected, by a mirror, to the beam splitter. The first and second beams go in the beam splitter, come out thereof, and are combined into a resultant beam toward the first direction. The resultant beam is further projected onto the substrate having a layer of photoresist coating. Thus two patterns from the double masks can be superposed onto the layer of photoresist coated on the substrate by one exposure, which reduces manufacturing cost, increase manufacturing throughput, and eliminate alignment issues. The first and second beams may be polarized and may be used with a polarized beam splitter such that the resultant beam is totally directed and projected to the substrate. The first and second beams may be orthogonal polarized light and split from one source. During a lithography process, a beam defined by the slot may scan over the mask to expose one field. The scanning direction may depend on the configuration of the double-mask lithography system and the beam splitter, which may be long, flat, or other suitable shape.

An exemplary exposing process implemented in the double-mask lithography system 100 may be described below. Loading the first mask 132 and the second mask 136 to the mask stage module 130. For example, the first and second masks may be load onto the two separate mask stages. Then load the substrate having a photoresist coating layer to the substrate stage. Then adjust the mask stage module and the substrate stage in a transitional and rotational modes to align the first mask and the second mask with the substrate; then turn on the first and second beams to illuminate the substrate; and then the substrate may be developed for the resultant pattern.

As another example, the beam splitter may have a structure as illustrated in FIG. 2b, which comprises two normal beam splitters or one mirror and one normal beam splitter. In this configuration, a separate mirror is eliminated. Furthermore, the lithography system 100 may include more than one beam combiner 140 in cascade configured to combiner more beams from additional masks. In general, the spirit of the present disclosure may not be limited to a photolithography system. The radiation source may be extended to x-ray, e-beam, ion beam, or other suitable radiation source. The beam combiner may also be other suitable combiner accordingly. For example, the beam splitter may be an e-beam combiner if e-beam is employed. Provided below are several embodiments of the double-mask lithography system 100.

Figure 3A:
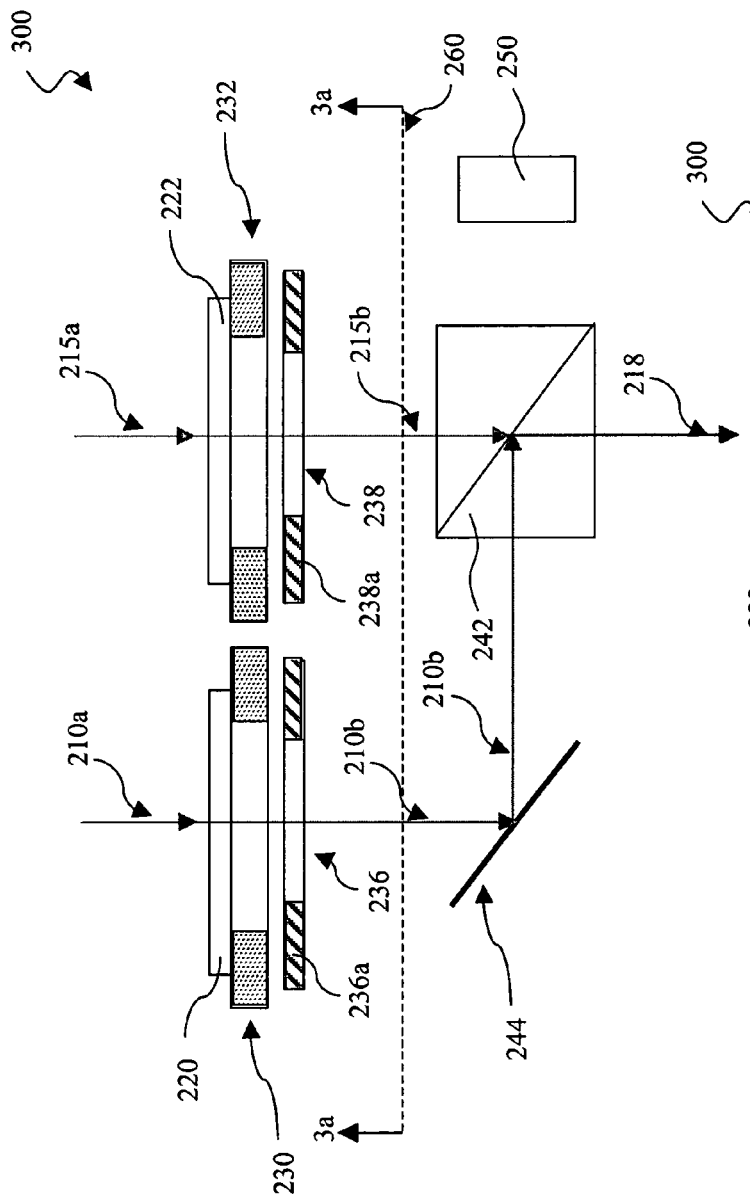
Figure 3B:
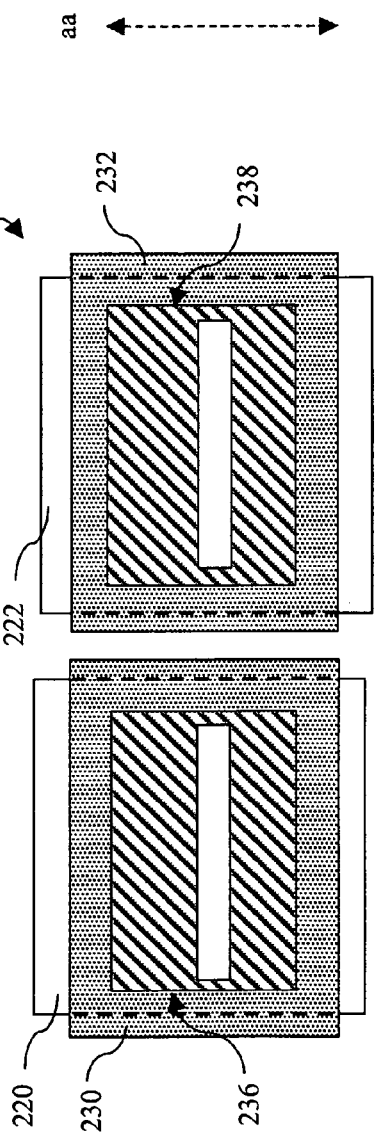

FIG. 3a illustrates a sectional view of one embodiment of a double-mask lithography system 300 having two mask stages. FIG. 3b illustrates a schematic top view of an embodiment of the double-mask lithography system of FIG. 3a taken along dotted line 260.

Referring to FIGS. 3a and 3b, the double-mask lithography system 300 may include a first mask stage 230 to hold a first mask 220 and a second mask stage 232 to hold a second mask 222. The first and second mask stages hold the first and second masks in parallel. The first and second mask stages may be adjusted in translational and rotational modes. The first and second stages are configured substantially side-by-side. The double-mask lithography system 300 may further comprise a first slot 236 configured under the first mask stage 230 and a second slot 238 configured under the second mask stage 232 wherein the first and second slots define the first and second beams, respectively. The first slot 236 further comprises an opaque frame 236a and the second slot 238 further comprises an opaque frame 238a. Portions of the opaque frames 236a and 238a are shown with dotted lines in FIG. 3b for the sake of reference.

The double-mask lithography system 300 may comprise a beam splitter 242 and a mirror 244 configured for mask superposing. The beam splitter may be a flat beam splitter similar to the flat beam splitter 142a illustrated in FIG. 2a. The scanning during exposure process may be in a direction "aa" as illustrated in FIG. 3b. The double-mask lithography system 300 may further include a beam monitor 250 configured for monitoring. The double-mask lithography system 300 may comprise other components including a radiation source, a condenser lens, an imaging lens, and a substrate stage holding a substrate having a layer of photoresist coating, which may be substantially similar to those in the double-mask lithography system of FIG. 1. The above components are configured and aligned such that superposition of double mask patterns is implemented. A first beam 210a is directed on the first mask 220 and is transformed to the beam 210b carrying a first pattern of the first mask 220. The beam 210b is redirected by the mirror 244 to the beam splitter 242. A second beam 215a is directed on the second mask 222 and is transformed to the beam 215b carrying a second pattern of the second mask 222, heading to the beam splitter 242. The first beam 210b and the second beam 215b are combined by the beam splitter into a resultant beam 218 having a superposing pattern of the first pattern and the second pattern. The resultant beam is projected to the substrate for exposure.

Figure 4:
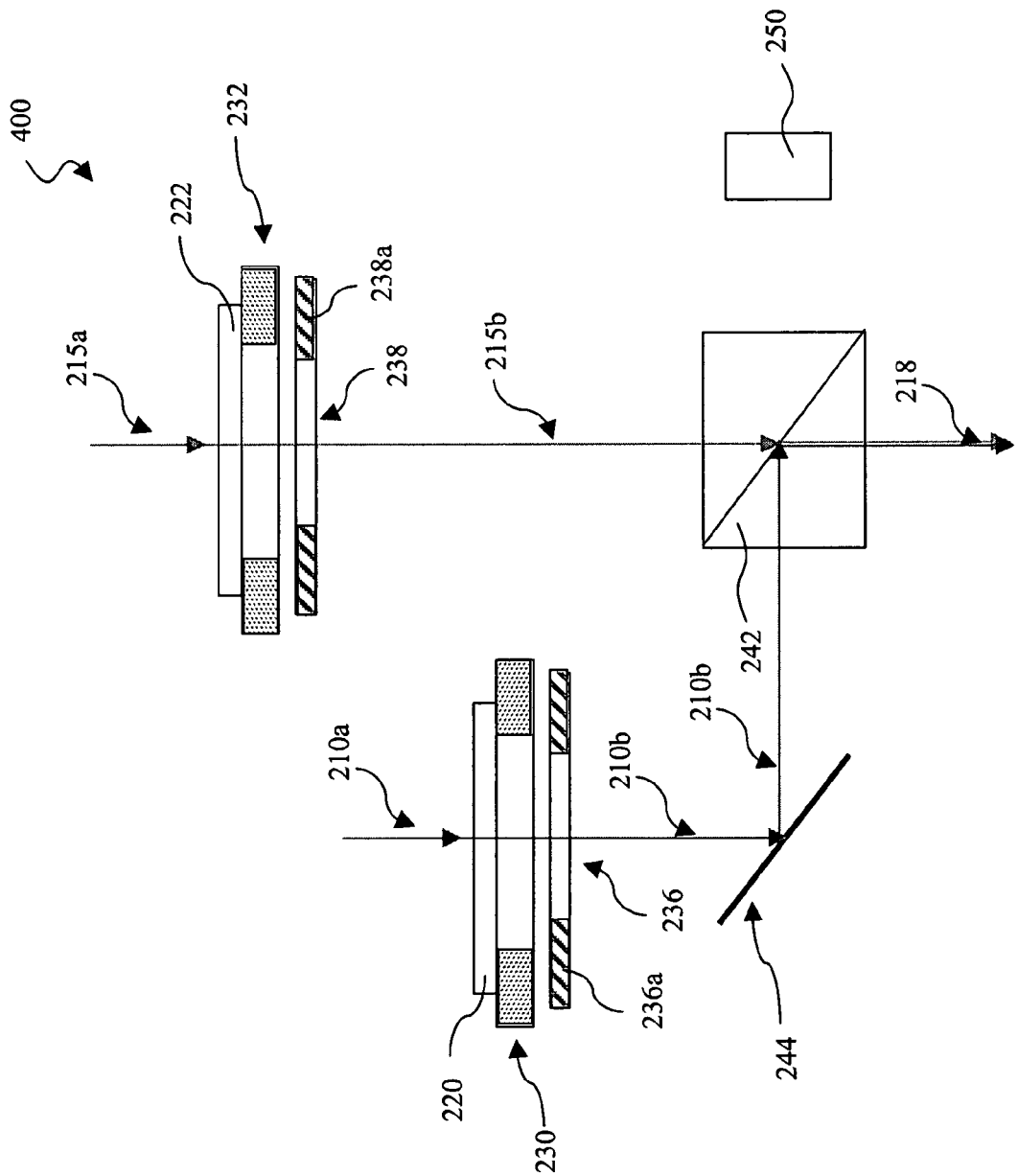

Referring to FIG. 4, illustrated is a sectional view of an embodiment of a double-mask lithography system 400 having two mask stages. The double-mask lithography system 400 may include a first mask stage 230 to hold a first mask 220 and a second mask stage 232 to hold a second mask 222. The first and second mask stages hold the first and second masks in parallel. The first and second mask stages may be adjustable in translational and rotational modes. The double-mask lithography system 400 may further comprise a first slot 236 configured under the first mask stage 230 and a second slot 238 configured under the second mask stage 232 wherein the first and second slots define the first and second beams, respectively. The first slot 236 further comprises an opaque frame 236a and the second slot 238 further comprises an opaque frame 238a.

The double-mask lithography system 400 may comprise a beam splitter 242 and a mirror 244 configured for mask superposing. The double-mask lithography system 400 may further include a beam monitor configured for monitoring. The double-mask lithography system 400 may comprise other components including a radiation source, a condenser lens, an imaging lens, and a substrate stage holding a substrate having a layer of photoresist coating, substantially similar to those in the double-mask lithography system 100 of FIG. 1.

The double-mask lithography system 400 may be similar to the double-mask system 300 of FIGS. 3a and 3b except for that the first and second mask stages in FIG. 4 are configured apart from each other such that a first optical path from the first mask to the beam splitter substantially equals a second optical path from the second mask to the beam splitter.

Figure 5:
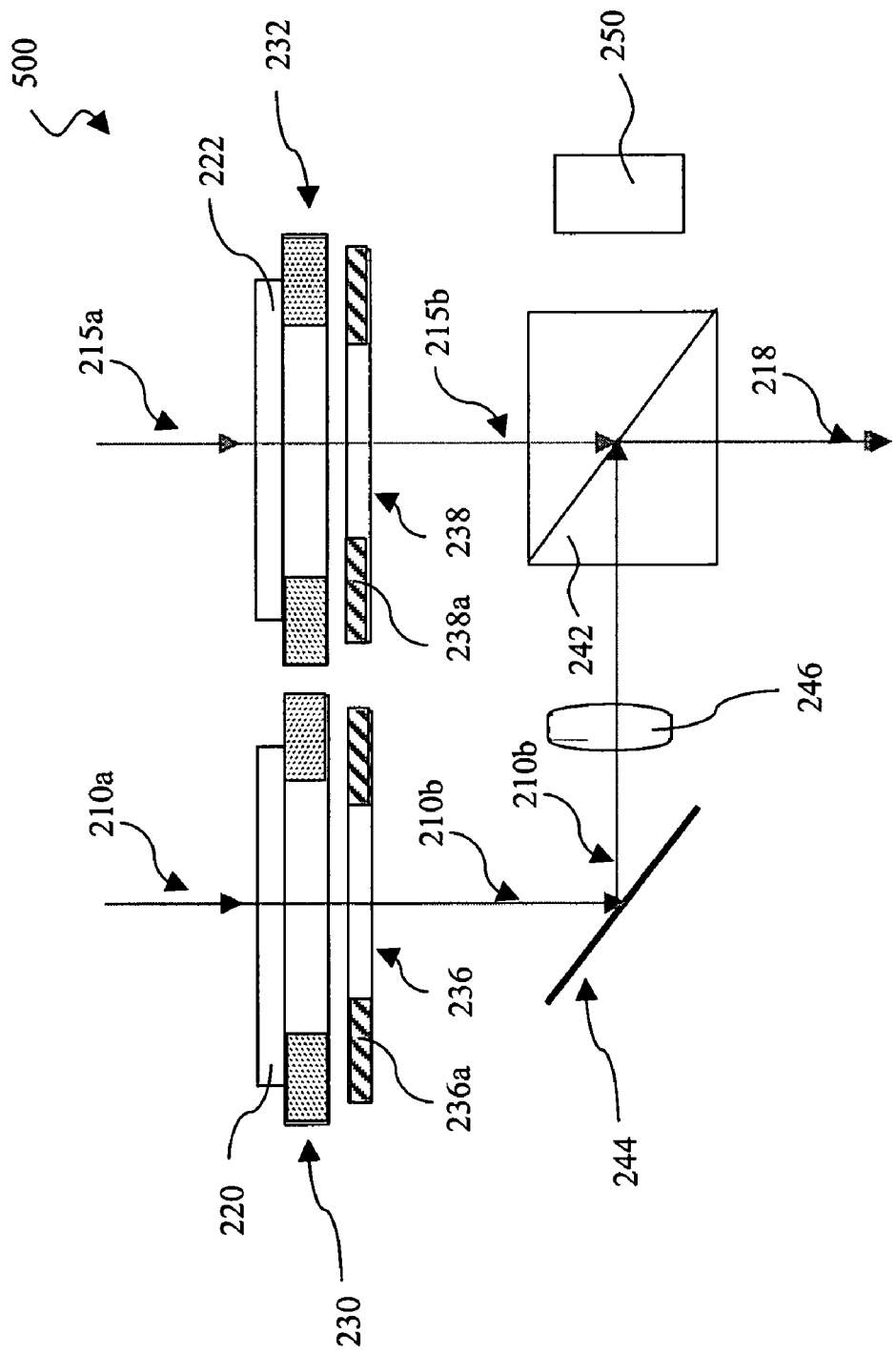

Referring to FIG. 5, illustrated is a sectional view of an embodiment of a double-mask lithography system 500 having two mask stages. The double-mask lithography system 500 may include a first mask stage 230 to hold a first mask 220 and a second mask stage 232 to hold a second mask 222. The first and second mask stages hold the first and second masks in parallel. The first and second mask stages may be adjustable in translational and rotational modes. The first and second mask stages may be configured side-by-side. The double-mask lithography system 500 may further comprise a first slot 236 configured under the first mask stage 230 and a second slot 238 configured under the second mask stage 232 wherein the first and second slots define the first and second beams, respectively. The first slot 236 further comprises an opaque frame 236a and the second slot 238 further comprises an opaque frame 238a.

The double-mask lithography system 500 may comprise a flat beam splitter 242 and a mirror configured for mask superposing. The double-mask lithography system 500 may further include a beam monitor configured for monitoring. The double-mask lithography system 500 may comprise other components including a radiation source, a condenser lens, an imaging lens, and a substrate stage holding a substrate having a layer of photoresist coating, which are substantially similar to those in the double-mask lithography system 100 of FIG. 1.

The double-mask system 500 may be similar to the double-mask system 300 of FIGS. 3a and 3b except that the double-mask system 500 further comprises a relay lens 246 positioned in one of a first optical path 210b and a second optical path 215b. As a result, the first optical path from the first mask to the beam splitter is substantially equal to the second optical path from the second mask to the beam splitter.

FIGS. 6a and 6b illustrate a sectional and top views of an embodiment of a double-mask lithography system 600 having two mask stages, respectively. The top view of FIG. 6b is taken along dotted line 260 of FIG. 6a. The double-mask lithography system 600 may include a first mask stage 230 to hold a first mask 220 and a second mask stage 232 to hold a second mask 222. The first and second mask stages hold the first and second masks in parallel. The first and second mask stages may be adjustable in translational and rotational modes. The first and second stages may be configured substantially side-by-side. The double-mask lithography system 600 may further comprise a first slot 236 configured under the first mask stage 230 and a second slot 238 configured under the second mask stage 232 wherein the first and second slots define the first and second beams, respectively. The first slot 236 further comprises an opaque frame 236a and the second slot 238 further comprises an opaque frame 238a. Portions of the opaque frames 236a and 238a are shown with dotted lines in FIG. 6b for the sake of reference.

The double-mask lithography system 600 may comprise a long beam splitter 242 and a mirror configured for mask superposing. The double-mask lithography system 600 may further include a beam monitor configured for beam monitoring and other components including a radiation source, a condenser lens, an imaging lens, and a substrate stage holding a substrate having a layer of photoresist coating, which are substantially similar to those in the double-mask lithography system 100 of FIG. 1. The above components are configured and aligned such that superposition of double mask patterns is implemented.

The long beam splitter may be substantially similar to the long beam splitter 142b illustrated in FIG. 2a and the mirror 244 is a long one accordingly. In present configuration, the scanning of exposing process may be in a direction "bb" as illustrated in FIG. 6b.

Figure 7A:
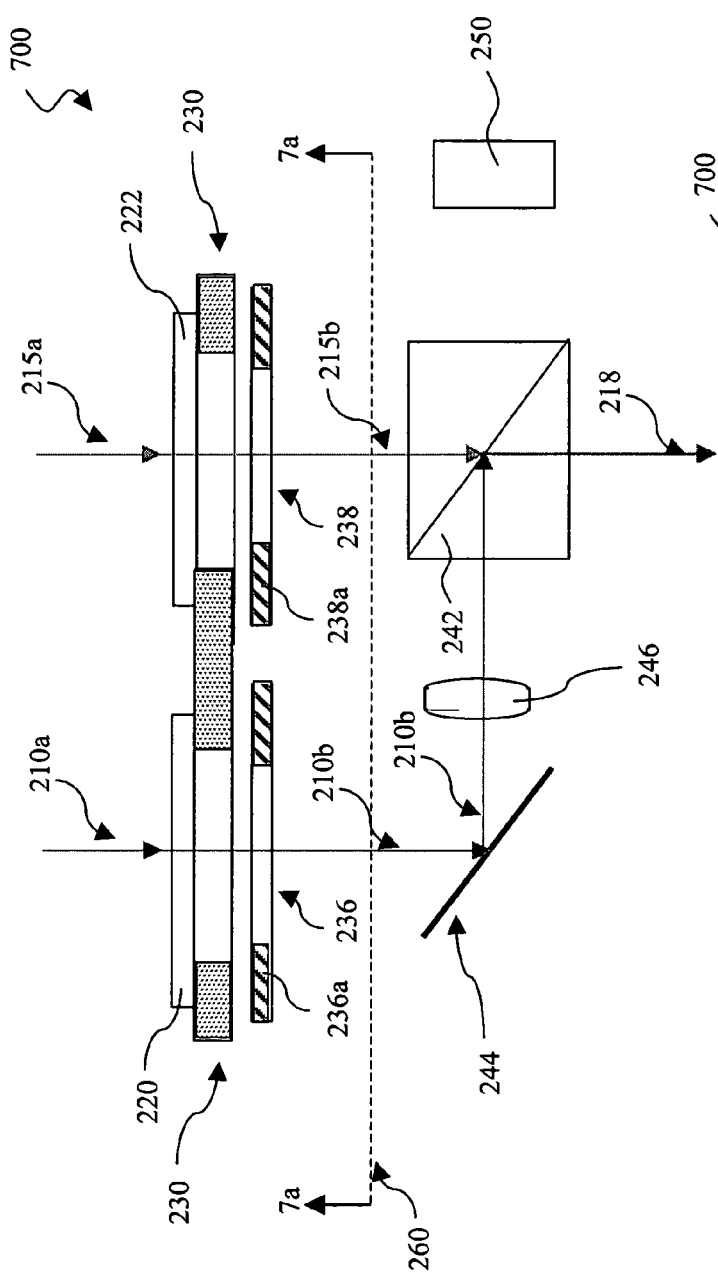
FIGS. 7a and 7b are a sectional and top views of an embodiment of a double-mask lithography system having a single mask stage, respectively.
Figure 7B:
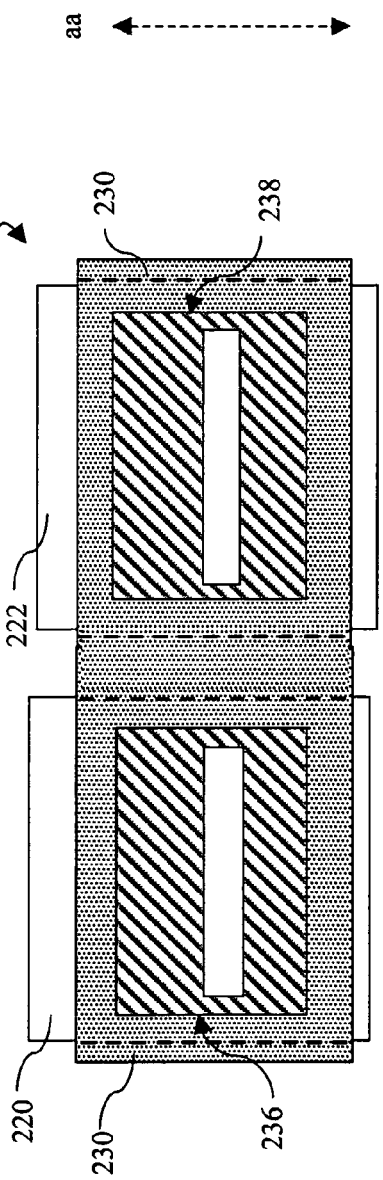

Referring to FIGS. 7a and 7b, illustrated are a sectional and top views, respectively, of an embodiment of a double-mask lithography system 700 having a single mask stage 230 to hold a first mask 220 and a second mask 222. The top view of FIG. 7b is taken along dotted line 260 of FIG. 7a. The first and second masks are held in parallel. The single mask stage is adjustable in translational and rotational modes. Further, at least one of the first and second masks is adjustable in translational and rotational modes relative the another mask. The double-mask lithography system 700 may further comprise a first slot 236 configured under the first mask 220 and a second slot 238 configured under the second mask 222 wherein the first and second slots define the first and second beams, respectively. The first slot 236 further comprises an opaque frame 236a and the second slot 238 further comprises an opaque frame 238a. Portions of the opaque frames 236a and 238a are shown with dotted lines in FIG. 3b for the sake of reference.

The double-mask lithography system 700 may comprise a beam splitter 242 and a mirror 244 configured for mask superposing. The double-mask lithography system 700 may further comprise a relay lens 246 configured such that a first optical beam 210b from the first mask to the beam splitter 242 and a second beam 215b form the second mask 222 to the beam splitter 242 substantially equal. The double-mask lithography system 700 may further include a beam monitor configured for monitoring. The double-mask lithography system 700 may comprise other components including a radiation source, a condenser lens, an imaging lens, and a substrate stage holding a substrate having a layer of photoresist coating, substantially similar to those in the double-mask lithography system of FIG. 1.

The above components are configured and aligned such that superposition of double mask patterns is implemented. A first beam 210a is directed on the first mask 220 and is transformed to the beam 210b having a first pattern of the first mask 220. The beam 210b is redirected by the mirror 244 to the beam splitter 242. A second beam 215a is directed on the second mask 222 and is transformed to the beam 215b having a second pattern of the second mask 222, directing to the beam splitter 242. The first beam 210b and the second beam 215b are combined by the beam splitter into a resultant beam 218 having a superposing pattern of the first pattern and the second pattern. The resultant beam is projected to the substrate for exposure. The beam splitter may be a flat one substantially similar to the flat beam splitter 142a illustrated in FIG. 2a. The scanning direction during exposing process may be in a direction "aa" as illustrated FIG. 7b.

Referring to FIGS. 8a and 8b, illustrated are sectional and top views, respectively, of an embodiment of a double-mask lithography system 800 having a single mask stage. The top view of FIG. 8b is taken along dotted line 260 of FIG. 8a. The double-mask lithography system 800 may include a single mask stage 230 to hold a first mask 220 and a second mask 222. The first and second masks are held in parallel. The single mask stage is adjustable in translational and rotational modes. Further, at least one of the first and second mask is adjustable in translational and rotational modes relative to the other mask. The double-mask lithography system 800 may further comprise a first slot 236 configured under the first mask 220 and a second slot 238 configured under the second mask 222 wherein the first and second slots define the first and second beams, respectively. The first slot 236 further comprises an opaque frame 236a and the second slot 238 further comprises an opaque frame 238a. Portions of the opaque frames 236a and 238a are shown with dotted lines in FIG. 3b for the sake of reference.

The double-mask lithography system 800 may comprise a long beam splitter 242 and a mirror configured for mask superposing. The double-mask lithography system 800 may further comprise a relay lens 246 configured such that a first optical beam 210b from the first mask to the beam splitter 242 and a second beam 215b from the second mask 222 to the beam splitter 242 substantially equal. The double-mask lithography system 800 may further include a beam monitor 250 configured for monitoring. The double-mask lithography system 800 may comprise other components including a radiation source, a condenser lens, an imaging lens, and a substrate stage holding a substrate having a layer of photoresist coating, substantially similar to those in the double-mask lithography system 100 of FIG. 1. The above components are configured and aligned such that superposition of double mask patterns can be implemented. The long beam splitter 242 is substantially similar to the long beam splitter 142b illustrated in FIG. 2a and the mirror 244 is a long mirror accordingly. In present configuration, the scanning of exposing process may be in a direction "bb" as illustrated in FIG. 8b.

Figure 9A:
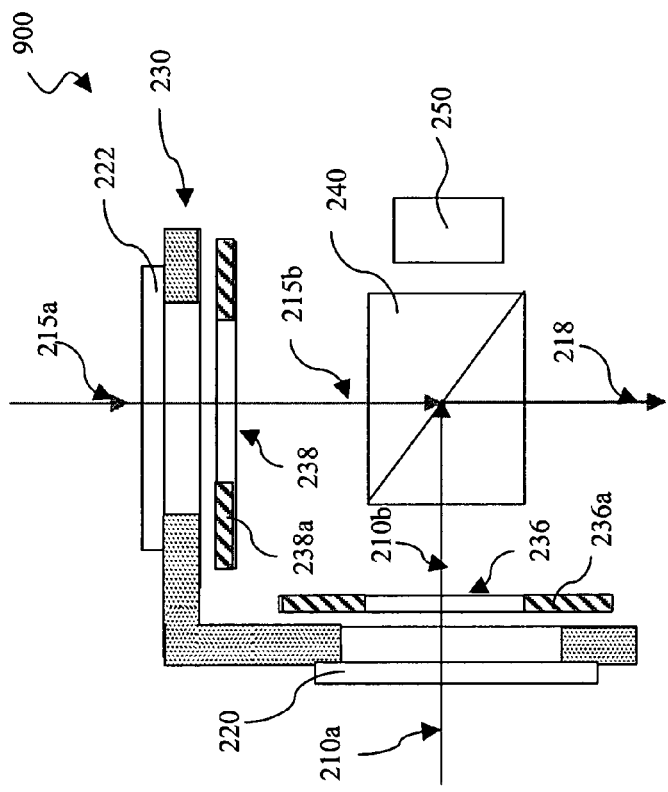
FIGS. 9a and 9b are a sectional and top views of an embodiment of a double-mask lithography system having an L-shaped mask stage, respectively.
Figure 9B:
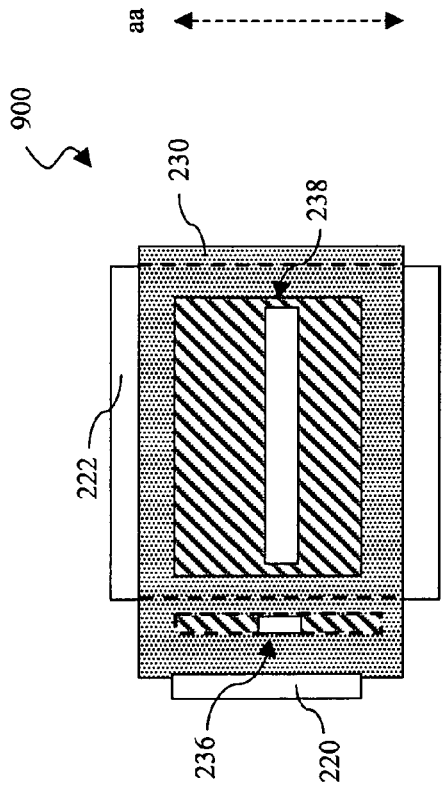

Referring to FIGS. 9a and 9b, illustrated are a sectional and top views, respectively, of an embodiment of a double-mask lithography system 900 having an L-shaped mask stage. The double-mask lithography system 900 may include an L-shaped mask stage 230. The L-shaped has two arms perpendicular to each other. One arm holds a first mask 220 and the another arm holds a second mask 222 such that the first and second masks are held perpendicular to each other. The L-shaped mask stage may be adjustable in translational and rotational modes. Further, at least one of the first and second masks is adjustable in translational and rotational modes relative to the other mask. The double-mask lithography system 900 may further comprise a first slot 236 configured under the first mask 220 and a second slot 238 configured under the second mask 222 wherein the first and second slots define the first and second beams, respectively. The first slot 236 further comprises an opaque frame 236a and the second slot 238 further comprises an opaque frame 238a. Portions of the opaque frames 236a and 238a are shown with dotted lines in FIG. 3b for the sake of reference.

The double-mask lithography system 900 may comprise a beam splitter 240 configured for mask superposing. The double-mask lithography system 900 may further include a beam monitor 250 configured for monitoring. FIG. 9b skips over features 240 and 250 for clarity. The double-mask lithography system 900 may comprise other components including a radiation source, a condenser lens, an imaging lens, and a substrate stage holding a substrate having a layer of photoresist coating, substantially similar to those in the double-mask lithography system 100 of FIG. 1. The above components are configured and aligned such that superposition of double mask patterns can be implemented. The beam splitter 240 may be a flat beam splitter similar to the flat beam splitter 142a illustrated in FIG. 2a. The scanning direction during exposing process may be in a direction "aa" as illustrated FIG. 9b.

Thus, the present disclosure provides an exposure system comprising a mask stage module adapted for holding a first mask and a second mask, wherein the first mask is configured for illumination by a first beam to form a transformed first beam having a first pattern and the second mask is configured for illumination by a second beam to form a transformed second beam having a second pattern; and a beam combiner configured to combine the transformed first and second beams to form a resultant beam, wherein the resultant beam is projected into a substrate coated with a photoresist layer.

In the exposure system, the beam combiner comprises a beam splitter. The beam splitter may be a flat beam splitter, a long bean splitter, and/or a polarized beam splitter. The exposure system may further comprise a beam monitor device configured next to the beam combiner to receive split portion of the first and second beams from the beam combiner. The beam combiner may comprise a mirror. The beam combiner may comprise a relay lens. The mask stage module is adjustable in transitional and rotational modes. The mask stage module comprises a first mask stage adapted for holding the first mask and a second mask stage adapted for holding the second mask. The first and second mask stages are configured such that a first optical path from the first mask stage to the substrate and a second optical path from the second mask stage to the substrate may be substantially equal. The mask stage module may comprise a single mask stage adapted for holding the first and second masks. The single mask stage may be configured for holding the first and second masks parallel to each other. The single mask stage may be configured for holding the first and second masks perpendicular to each other. The single mask stage may be designed such that the first mask and the second mask are adjustable relative to each other in translational and rotational modes. The mask stage module may have a scan function. The exposure system may further comprise a first slot under the first mask and a second slot under the second mask stage. The exposure system may further comprise at least one condenser lens. The exposure system may further comprise a substrate stage to hold the substrate. The exposure system may further comprise another second beam combiner configured with the beam combiner in cascade such that to combine a third beam having a third pattern from a third mask into the resultant beam.

The present disclosure provides an exposure system comprising a first mask stage adapted for holding a first mask wherein the first mask is configured for illumination by a first beam to form a transformed first beam having a first pattern; a second mask stage adapted for holding a second mask wherein the second mask is configured for illumination by a second beam to form a transformed second beam having a second pattern; and a beam splitter combining the first beam and the second beam to form a resultant beam wherein the resultant beam is projected into a substrate coated with a photoresist layer.

The exposure system may further comprise a mirror to direct the first beam to the beam splitter. The first and second mask stages may be configured such that the first mask and second mask are held parallel to each other. The first optical path of the first beam from the first mask to the beam splitter may substantially equal to a second optical path of the second beam form the second mask to the beam splitter. The first and second mask stages may be configured such that the first and second optical paths substantially equal to each other. The exposure system may further comprise a relay lens configured such that the first optical path substantially equals to the second optical path. The first mask stage and the second mask stage may be adjustable in transitional and rotational modes. The beam splitter may be a flat beam splitter, a long beam splitter, and/or a polarized beam splitter. The exposure system may further comprise a beam monitor device configured next to the beam splitter to receive split portion of the first and second beams from the beam splitter.

The present disclosure provides an exposure system comprising a single mask stage adapted for holding a first mask and a second mask wherein the first mask is configured for illumination by a first beam to form a transformed first beam having a first pattern and the second mask is configured for illumination by a second beam to form a transformed second beam having a second pattern; and a beam splitter combining the first beam and the second beam to form a resultant beam wherein the resultant beam is projected into a substrate coated with a photoresist layer.

The exposure system may further comprise a mirror to direct the first beam to the beam splitter. The single mask stage may be configured such that the first mask and second mask are held parallel to each other. The single mask stage may be configured such that the first mask and second mask are held perpendicular to each other. The single mask stage may be configured such that at least the first mask is adjustable in transitional and rotational modes relative to the second mask. The exposure system may further comprise a relay lens configured such that a first optical path of the first beam from the first mask to the beam splitter substantially equals to a second optical path of the second beam form the second mask to the beam splitter. The beam splitter may be a flat beam splitter, a long beam splitter, and/or a polarized beam splitter. The exposure system may further comprise a beam monitor device configured next to the beam splitter to receive split portion of the first and second beams from the beam splitter.

The present disclosure provides an exposure system comprising a L-shaped mask stage having a first arm and second arm being perpendicular to each other, adapted for holding a first mask on the first arm and a second mask on the second arm perpendicular to each other, the first mask configured for illumination by a first beam to form a transformed first beam having a first pattern, and the second mask configured for illumination by a second beam to form a transformed second beam having a second pattern; and a beam splitter configured next to the fist and second arms of the L-shaped mask stage, combining the first beam and the second beam to form a resultant beam, wherein the resultant beam is projected into a substrate coated with a photoresist layer.

The L-shaped mask stage may be designed such that at least the first mask is adjustable in transitional and rotational modes relative to the second mask. The exposure system may further comprise a beam monitor device configured next to the beam splitter to receive split portion of the first and second beams from the beam splitter. The beam splitter comprises a polarized beam splitter. The present disclosure provides a method of super imposing a first pattern from a first mask and a second pattern from a second mask comprising directing a first beam to the first mask, forming a transformed first beam having the first pattern; directing a second beam to the second mask, forming a transformed second beam having the second pattern; and combining the first beam and the second beam, forming a resultant beam by directing the transformed first beam and directing the transformed second beam to the beam splitter. The method may further comprise directing a split portion of the first and second beams from the beam splitter to a beam monitor device. The method may further comprise projecting the resultant beam into a substrate having a photoresist coating layer. In the method, directing the transformed first beam to the beam splitter may comprise directing the transformed first beam to a mirror and then from the mirror to the beam splitter. In the method, directing the transformed first beam to the beam splitter may comprise directing the transformed first beam through a relay lens configured such that the first beam and second beam have substantially equal optical path upon forming the resultant beam. In the method, directing a first beam and directing a second beam may comprise moving the first mask and moving the second mask such that the transformed first and second beams are substantially aligned in the resultant beam.

The present disclosure provides a method of illuminating a first pattern and a second pattern to a substrate having a photoresist coating layer comprising loading a first and second masks to a mask stage module; loading the substrate having a photoresist coating layer to a substrate stage; adjusting the mask stage module and the substrate stage to align the first mask and the second mask in a transitional and rotational modes; and illuminating the substrate by directing a first beam to the first mask to form a transformed first beam having a first pattern and directing a second beam to the second mask to form a transformed second beam having a second pattern, directing the transformed first beam and the second beam to a beam splitter to form a resultant beam, and projecting the resultant beam to the substrate.

The illumination may be taken from a single light source and a condenser system using a large condenser lens to cover both masks. Alternatively, light from a single source can be split into more than one condenser lens in a condenser system to cover each mask separately. Furthermore, more than one light source may be used.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An exposure system, comprising:
   a mask stage module adapted for holding a first mask and a second mask, wherein the first mask is configured for illumination by a first beam to form a transformed first beam having a first pattern from the first mask and the second mask is configured for illumination by a second beam to form a transformed second beam having a second pattern from the second mask;
   a first slot under the first mask;
   a second slot under the second mask; and
   a beam combiner configured to combine the transformed first and second beams to form a resultant beam, wherein the resultant beam is projected into a substrate coated with a photoresist layer.

2. The exposure system of claim 1 wherein the beam combiner comprises a beam splitter.

3. The exposure system of claim 2 wherein the beam splitter comprises a long beam splitter.

4. The exposure system of claim 2 wherein the beam splitter comprises a polarizing beam splitter.

5. The exposure system of claim 2 wherein the beam splitter comprises a flat beam splitter.

6. The exposure system of claim 1 further comprising a beam monitor device configured next to the beam combiner to receive split portion of the first and second beams from the beam combiner.

7. The exposure system of claim 1 wherein the beam combiner comprises a relay lens.

8. The exposure system of claim 1 wherein each of the first slot and second slot includes a first dimension in a first direction and a second dimension in a second direction defining an instantaneous scanning area, the first dimension being greater than the second dimension.

9. The exposure system of claim 1 wherein the first mask is a phase shift mask and the second mask is a binary mask.

10. The exposure system of claim 8 is adapted for scanning during an exposing process along the second direction.

11. The exposure system of claim 10 wherein the first and second slots are configured such that an axis of the first slot along the first direction and an axis of the second slot along the first direction are substantially aligned in a line.

12. The exposure system of claim 10 wherein the first and second slots are configured such that an axis of the first slot along the second direction and an axis of the second slot along the second direction are substantially aligned in a line.

13. The exposure system of claim 8 wherein the first dimension and the second dimension have a ratio about 26 to 5.

14. The exposure system of claim 3 wherein the long beam splitter includes three dimensions in a ratio about 6:6:28.

15. The exposure system of claim 5 wherein the flat beam splitter includes three dimensions in a ratio about 28:28:6.

16. The exposure system of claim 1 wherein the first slot under the first mask and a the second slot under the second mask are designed and configured for a continuous scanning of the first and second masks during an exposing process.

17. The exposure system of claim 16 wherein the slot and second slot are fixed and each of the first and second masks are operable to move the slots in the continuous scanning of the exposure process.

18. An exposure system, comprising:
    a mask stage module adapted for holding a first mask, a second mask and a third mask, wherein the first mask is configured for illumination by a first beam to form a transformed first beam having a first pattern from the first mask, the second mask is configured for illumination by a second beam to form a transformed second beam having a second pattern from the second mask and the third mask is configured for illumination by a third beam to form a transformed third beam having a third pattern from the third mask;
    a first beam combiner configured to combine the transformed first and second beams to form a first resultant beam; and
    a second beam combiner configured with the first beam combiner in cascade to combine the first resultant beam and the transformed third beam to form a second resultant beam, wherein the second resultant beam is projected into a substrate coated with a photo-sensitive layer.

19. An exposure system, comprising:
    an L-shaped mask stage having a first arm and second arm being perpendicular to each other, adapted for holding a first mask on the first arm and a second mask on the second arm perpendicular to each other, the first mask configured for illumination by a first beam to form a first pattern, and the second mask configured for illumination by a second beam to form a second pattern; a first slot configured between the first arm and the beam splitter; a second slot configured between the second arm and the beam splitter and
    a beam splitter configured next to the first and second arms of the L-shaped mask stage, combining the first pattern and the second pattern to form a resultant pattern, wherein the resultant pattern is projected into a substrate coated with a photoresist layer.

20. The exposure system of claim 19 wherein the L-shaped mask stage is designed such that at least the first mask is adjustable in translational and rotational modes relative to the second mask.

* * * * *

UNITED STATES PATENT AND TRADEMARK OFFICE
CERTIFICATE OF CORRECTION

| | | |
|---|---|---|
| PATENT NO. | : 7,394,080 B2 | Page 1 of 2 |
| APPLICATION NO. | : 11/317974 | |
| DATED | : July 1, 2008 | |
| INVENTOR(S) | : Burn Jeng Lin | |

It is certified that error appears in the above-identified patent and that said Letters Patent is hereby corrected as shown below:

Column 12, Claim 19, line 44, should be corrected as follows:

FROM:
19. An exposure system, comprising:
    an L-shaped mask stage having a first arm and second arm being perpendicular to each other, adapted for holding a first mask on the first arm and a second mask on the second arm perpendicular to each other, the first mask configured for illumination by a first beam to form a first pattern, and the second mask configured for illumination by a second beam to form a second pattern; and
    a first slot configured between the first arm and the beam splitter;
    a second slot configured between the second arm and the beam splitter and
    a beam splitter configured next to the first and second arms of the L-shaped mask stage, combining the first pattern and the second pattern to form a resultant pattern, wherein the resultant pattern is projected into a substrate coated with a photoresist layer.

TO:

-- 19. An exposure system, comprising:
    an L-shaped mask stage having a first arm second arm being perpendicular to each other, adapted for holding a first mask on the first arm and a second mask on the second arm perpendicular to each other, the first mask configured for illumination by a first beam to form a first pattern, and the second mask configured for illumination by a second beam to form a second pattern; and

UNITED STATES PATENT AND TRADEMARK OFFICE
CERTIFICATE OF CORRECTION

PATENT NO. : 7,394,080 B2  
APPLICATION NO. : 11/317974  
DATED : July 1, 2008  
INVENTOR(S) : Burn Jeng Lin It is certified that error appears in the above-identified patent and that said Letters Patent is hereby corrected as shown below:

a beam splitter configured next to the first and second arms of the L-shaped mask stage, combining the first pattern and the second pattern to form a resultant pattern, wherein the resultant pattern is projected into a substrate coated with a photoresist layer. --

Signed and Sealed this

Twenty-third Day of September, 2008

JON W. DUDAS  
*Director of the United States Patent and Trademark Office*